(12) United States Patent
Shimbo

(10) Patent No.: US 11,688,814 B2
(45) Date of Patent: Jun. 27, 2023

(54) SEMICONDUCTOR INTEGRATED CIRCUIT DEVICE

(71) Applicant: SOCIONEXT INC., Yokohama (JP)

(72) Inventor: Hiroyuki Shimbo, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/674,568

(22) Filed: Feb. 17, 2022

(65) Prior Publication Data

US 2022/0173254 A1 Jun. 2, 2022

Related U.S. Application Data

(63) Continuation of application No. 17/125,532, filed on Dec. 17, 2020, now Pat. No. 11,289,610, which is a (Continued)

(30) Foreign Application Priority Data

Feb. 25, 2016 (JP) .................................. 2016-034417

(51) Int. Cl.
*H01L 29/786* (2006.01)
*H01L 27/092* (2006.01)
(Continued)

(52) U.S. Cl.
CPC ........ *H01L 29/78696* (2013.01); *B82Y 10/00* (2013.01); *H01L 27/0207* (2013.01); *H01L 27/092* (2013.01); *H01L 27/11807* (2013.01); *H01L 29/0673* (2013.01); *H01L 29/42392* (2013.01); *H01L 21/823807* (2013.01); *H01L 21/823871* (2013.01); *H01L 29/775* (2013.01)

(58) Field of Classification Search
CPC .......... H01L 29/0665; H01L 29/66439; H01L 29/66469; H01L 29/78687; H01L 29/78696
See application file for complete search history.

(56) References Cited

U.S. PATENT DOCUMENTS

2005/0280031 A1   12/2005   Yano
2011/0057163 A1   3/2011   Liu et al.
(Continued)

FOREIGN PATENT DOCUMENTS

| JP | 2006-5103 A | 1/2006 |
| JP | 2015-19067 A | 1/2015 |
| WO | 2009/150999 A1 | 12/2009 |

OTHER PUBLICATIONS

Chinese Office Action issued in corresponding Chinese Patent Application No. 2017800118429, dated Apr. 14, 2022, with English translation.
(Continued)

*Primary Examiner* — Calvin Y Choi
(74) *Attorney, Agent, or Firm* — McDermott Will & Emery LLP

(57) ABSTRACT

In a standard cell including nanowire FETs, pads connected to nanowires are arranged at a predetermined pitch in X direction along which the nanowires extend. A cell width of the standard cell is an integral multiplication of the pitch. In a case where the standard cell is arranged to constitute the layout of a semiconductor integrated circuit device, the pads are regularly arranged in the X direction.

20 Claims, 12 Drawing Sheets

Related U.S. Application Data continuation of application No. 16/893,167, filed on Jun. 4, 2020, now Pat. No. 10,903,370, which is a continuation of application No. 16/110,661, filed on Aug. 23, 2018, now Pat. No. 10,707,354, which is a continuation of application No. PCT/JP2017/005697, filed on Feb. 16, 2017.

(51) Int. Cl.
    *H01L 27/02*     (2006.01)
    *H01L 29/06*     (2006.01)
    *H01L 27/118*     (2006.01)
    *H01L 29/423*     (2006.01)
    *H01L 21/8238*     (2006.01)
    *H01L 29/775*     (2006.01)
    *B82Y 10/00*     (2011.01)

(56) References Cited

U.S. PATENT DOCUMENTS

| | | |
|---|---|---|
| 2011/0133165 A1 | 6/2011 | Bangsaruntip et al. |
| 2013/0026451 A1* | 1/2013 | Bangsaruntip ......... B82Y 10/00 257/E29.245 |
| 2013/0224915 A1* | 8/2013 | Sleight ................ H01L 29/0673 438/197 |
| 2015/0014775 A1 | 1/2015 | Seo et al. |
| 2015/0370949 A1 | 12/2015 | Moroz et al. |
| 2016/0012169 A1* | 1/2016 | Chiang ............. H01L 29/42316 716/119 |

OTHER PUBLICATIONS

S. Bangsaruntip et al., "High performance and highly uniform gate-all-around silicon nanowire MOSFETs with wire size dependent scaling", Electron Devices Meeting (IEDM), 2009 IEEE International.

Isaac Laucer et al., "Si Nanowire CMOS Fabricated with Minimal Deviation from RMG FinFET Technology Showing Record Perfomance", 2015 Symposium on VLSI Technology Digest of Technical Papers.

International Search Report issued in International Application No. PCT/JP2017/005697 dated Mar. 21, 2017 (with English translation).

Written Opinion issued in International Application No. PCT/JP2017/005697 dated Mar. 21, 2017 (with partial English translation).

Non-Final Office Action dated Sep. 19, 2019 in corresponding U.S. Appl. No. 16/110,661.

Notice of Allowance dated Mar. 10, 2020 in corresponding U.S. Appl. No. 16/110,661.

Notice of Allowance dated Sep. 18, 2020 in corresponding U.S. Appl. No. 16/893,167.

Notice of Allowance dated Nov. 18, 2021 in corresponding U.S. Appl. No. 17/125,532.

* cited by examiner

SEMICONDUCTOR INTEGRATED CIRCUIT DEVICE

CROSS-REFERENCE TO RELATED APPLICATIONS

This application is a continuation of U.S. application Ser. No. 17/125,532, filed on Dec. 17, 2020, which in turn is a continuation of U.S. application Ser. No. 16/893,167 filed on Jun. 4, 2020, now U.S. Pat. No. 10,903,370, issued on Jan. 26, 2021, which is a continuation of U.S. application Ser. No. 16/110,661 filed on Aug. 23, 2018, now U.S. Pat. No. 10,707,354 issued Jul. 7, 2020, which is a continuation of International Application No. PCT/JP2017/005697 filed on Feb. 16, 2017, which claims priority to Japanese Patent Application No. 2016-034417 filed on Feb. 25, 2016. The entire disclosures of these applications are hereby incorporated by reference.

BACKGROUND

The present disclosure relates to a semiconductor integrated circuit device including a standard cell with a nanowire field effect transistor (FET).

A standard cell design has been known as a method of forming a semiconductor integrated circuit on a semiconductor substrate. The standard cell design refers to a method of designing a large-scale integrated circuit (LSI) chip by providing in advance, as standard cells, unit logic elements having particular logical functions (for example, an inverter, a latch, a flip-flop, and a full adder), laying out those standard cells on a semiconductor substrate, and connecting those standard cells together through an interconnect.

Reducing a gate length (scaling) of transistors that are a basic element of the LSI have achieved more integrated transistors, reduced an operating voltage, and improved an operating rate. However, recently, off-current has been increased due to excessive scaling, and power has been consumed more and more due to the increase in off-current, which are problems. In order to solve such problems, three-dimensional transistors having a three-dimensional structure that is changed from a conventional two-dimensional structure have been actively researched. As one technique, nanowire FETs draw attention.

An exemplary method of manufacturing a nanowire FET is disclosed in S. Bangsaruntip, et al. "High performance and highly uniform gate-all-around silicon nanowire MOSFETs with wire size dependent scaling", Electron Devices Meeting (IEDM), 2009 IEEE International, and Isaac Laucer, et al. "Si Nanowire CMOS Fabricated with Minimal Deviation from RMG Fin FET Technology Showing Record Performance", 2015 Symposium on VLSI Technology Digest of Technical Papers.

SUMMARY

So far, neither a structure of a standard cell with a nanowire FET nor a layout of a semiconductor integrated circuit device including such a nanowire FET has been specifically studied.

The present disclosure relates to a semiconductor integrated circuit device including a nanowire FET, and attempts to provide a layout configuration effective for easily manufacturing the device.

A first aspect of the present disclosure provides a semiconductor integrated circuit device including at least one standard cell including at least one nanowire field effect transistor (FET), the nanowire FET including: a nanowire extending along a first direction, the nanowire being a single nanowire or including a plurality of parallelly arranged nanowires; pads arranged at both ends of the nanowire in the first direction, having a lower surface below a lower surface of the nanowire, and connected to the nanowire; and a gate electrode extending along a second direction perpendicular to the first direction, and surrounding a periphery of the nanowire within a predetermined range of the nanowire in the first direction, wherein in the standard cell, the pads are arranged at a first pitch in the first direction, and a cell width of the standard cell that is a dimension of the standard cell in the first direction is an integral multiplication of the first pitch.

According to this aspect, in the standard cell including the nanowire FET(s), the pads connected to the nanowire are arranged at the first pitch Pp in the first direction along which the nanowire or the plurality of nanowires extends or extend. The cell width of the standard cell that is a dimension of the standard cell in the first direction is an integral multiplication of the first pitch. Therefore, in the case where the layout of the semiconductor integrated circuit device is configured by arranging the standard cell(s), the pads are regularly arranged in the first direction. Accordingly, in the semiconductor integrated circuit device including the nanowire FET(s), the pads are regularly arranged. This can make the manufacture of the device easy, reduce process induced variation, and improve yield.

A second aspect of the present disclosure provides a semiconductor integrated circuit device including first and second transistors that are nanowire FETs, each of the first and second transistors including: a nanowire extending along a first direction, the nanowire being a single nanowire or including a plurality of parallelly arranged nanowires; first and second pads arranged at both ends of the nanowire in the first direction at a first pitch, having a lower surface below a lower surface of the nanowire, and connected to the nanowire; a gate electrode extending along a second direction perpendicular to the first direction, and surrounding a periphery of the nanowire within a predetermined range of the nanowire in the first direction, wherein the first and second transistors are connected together in series, share the second pads, and arranged adjacent to one another in the first direction.

According to this aspect, in the first and second transistors that are the nanowire FETs, the first and second pads connected to the nanowire are arranged at the first pitch in the first direction in which the nanowire extends. The first and second transistors are connected together in series, share the second pads, and arranged adjacent to one another in the first direction. As a result, two transistors connected together in series can be formed with a configuration in which three pads are arranged at the first pitch in the first direction. Accordingly, in the semiconductor integrated circuit device including the nanowire FET(s), the pads are regularly arranged. This can make the manufacture of the device easy, reduce process induced variation, and improve yield.

A third aspect of the present disclosure provides a semiconductor integrated circuit device including first and second transistors that are nanowire FETs, each of the first and second transistors including: a nanowire extending along a first direction, the nanowire being a single nanowire or including a plurality of parallelly arranged nanowires; first and second pads arranged at both ends of the nanowire in the first direction at a first pitch, having a lower surface below a lower surface of the nanowire, and connected to the nanowire; a gate electrode extending along a second direction perpendicular to the first direction, and surrounding a periphery of the nanowire within a predetermined range of the nanowire in the first direction, wherein the first and second transistors are connected together in parallel, share the second pads, and arranged adjacent to one another in the first direction.

According to this aspect, in the first and second transistors that are the nanowire FETs, the first and second pads connected to the nanowire are arranged at the first pitch in the first direction in which the nanowire extends. The first and second transistors are connected together in parallel, share the second pads, and arranged adjacent to one another in the first direction. As a result, two transistors connected together in parallel can be formed with a compact configuration in which three pads are arranged at the first pitch in the first direction. Accordingly, in the semiconductor integrated circuit device including the nanowire FET(s), the pads are regularly arranged. This can make the manufacture of the device easy, reduce process induced variation, and improve yield.

According to the present disclosure, in the semiconductor integrated circuit device including the nanowire FET(s), the pads are regularly arranged. This can make the manufacture of the device easy, reduce process induced variation, and improve yield.

DETAILED DESCRIPTION

An embodiment will be described below with reference to the drawings. In the following description of the embodiment, it is assumed that a semiconductor integrated circuit device includes a plurality of standard cells, at least some of which includes a nanowire field effect transistor (FET).

Figure 14:
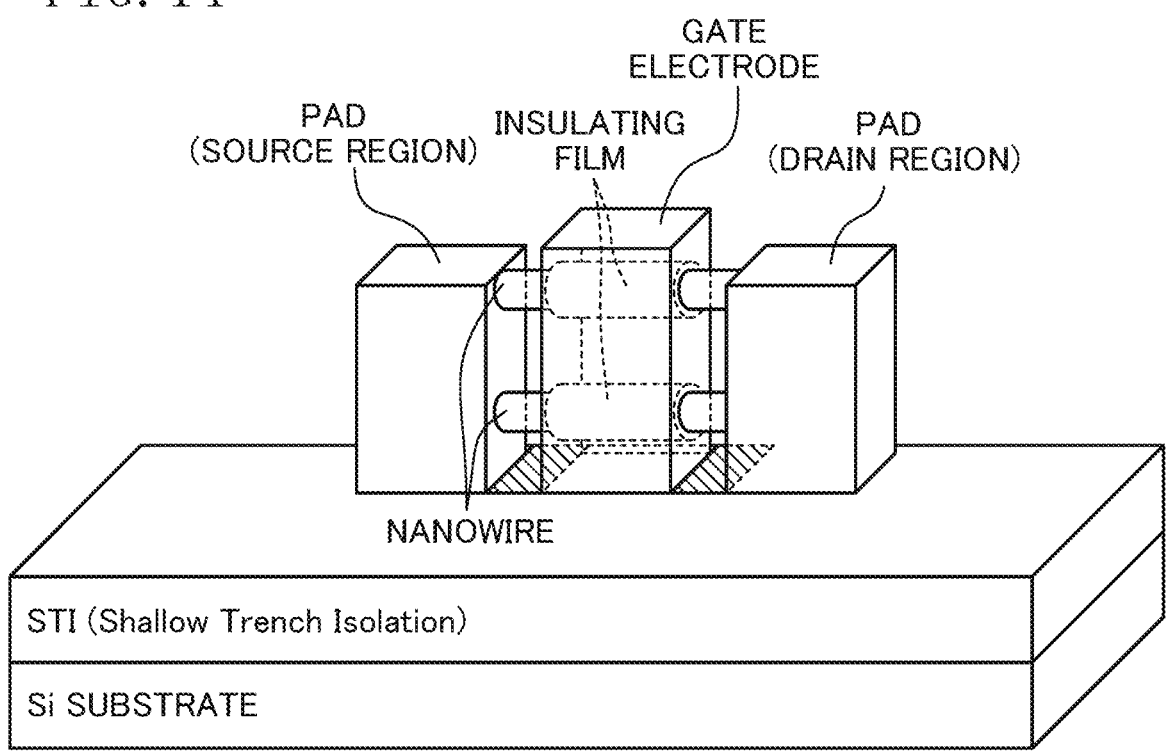
FIG. 14 schematically illustrates a basic configuration for the nanowire FET.

FIG. 14 schematically illustrates an exemplary basic configuration of the nanowire FET (which is also called a gate all around (GAA) configuration). The nanowire FET is an FET including a thin wire (nanowire) through which a current flows. The nanowire is made of, e.g., silicon. As illustrated in FIG. 14, the nanowire is formed so as to extend horizontally above a substrate, i.e., extend parallel to the substrate, and has both ends connected to elements serving as source and drain regions of the nanowire FET. In this specification, in a nanowire FET, elements connected to both ends of a nanowire and serving as source and drain regions of the nanowire FET are each called a pad. In FIG. 14, a shallow trench isolation (STI) is formed on an Si substrate. However, the Si substrate is exposed in an (hatched) area under the nanowire. The hatched area may actually be covered with, e.g., a thermal oxide film. In FIG. 14, such a film is omitted for the sake of simplicity.

The nanowire is surrounded by a gate electrode comprised of, e.g., polysilicon via an insulating film such as a silicon oxide film. The pads and the gate electrode are formed on the substrate surface. With this configuration, all of upper, lower, and both side portions of a channel region of the nanowire are surrounded by the gate electrode, and thus, the electric field is evenly applied to the channel region, improving switching characteristics of the FET.

In the pad, although at least the area to which the nanowire is connected serves as the source/drain region, an area below the area to which the nanowire is connected does not necessarily serve as the source/drain region. A portion of the nanowire (an area not surrounded by the gate electrode) may serve as the source/drain region.

In FIG. 14, two nanowires are disposed in the vertical direction, i.e., a direction perpendicular to the substrate. However, the number of the nanowires is not limited to two. Alternatively, one or three or more nanowires may be arranged in the vertical direction. In FIG. 14, the upper end of the uppermost nanowire is at the same height as the upper end of the pad. However, the upper ends of these components do not necessarily have to be at the height, and the upper end of the pad may be situated above the upper end of the uppermost nanowire.

Figure 15:
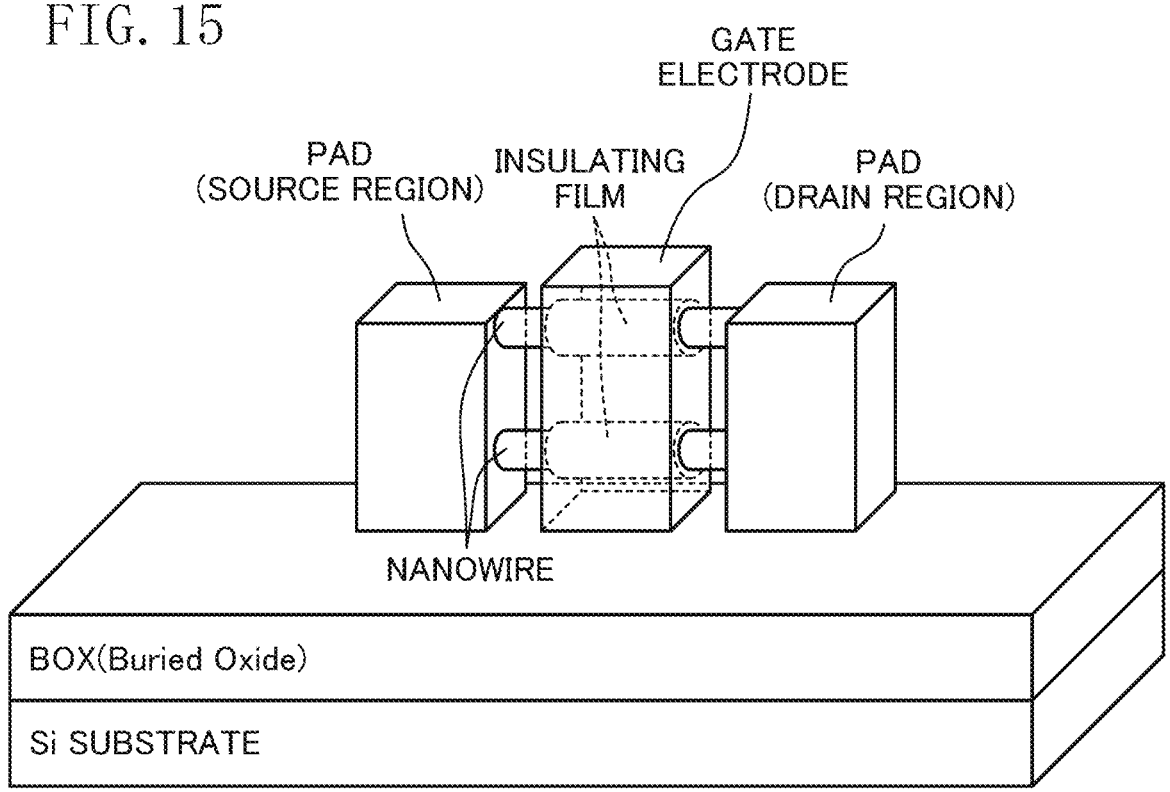
FIG. 15 schematically illustrates another basic configuration for the nanowire FET.

As shown in FIG. 15, in some cases, a buried oxide (BOX) is formed on the upper surface of the substrate, and the nanowire FET is formed on the BOX.

(Standard Cell 1)

Figure 1:
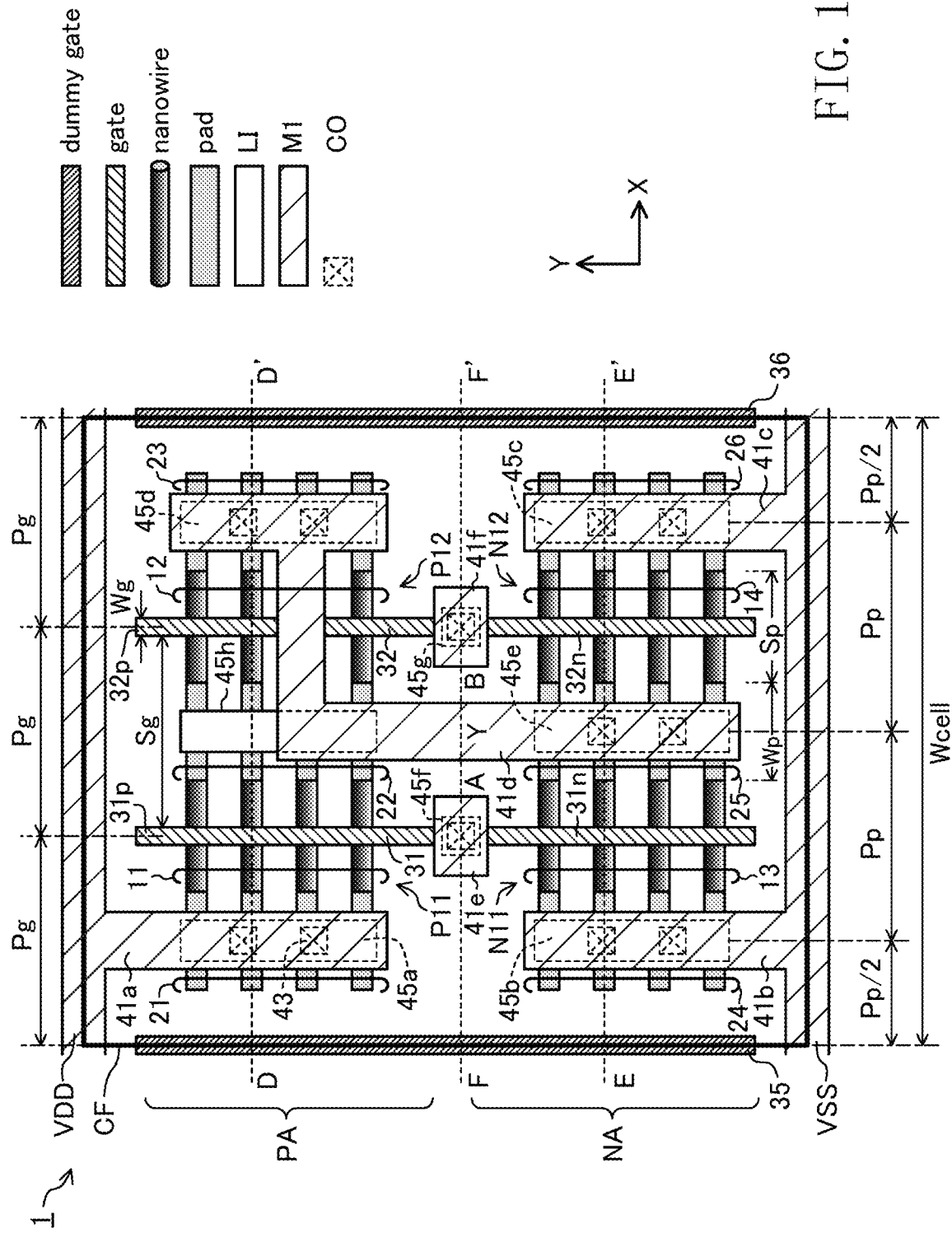
FIG. 1 is a plan view illustrating an exemplary configuration for a standard cell with a nanowire FET.
Figure 2:
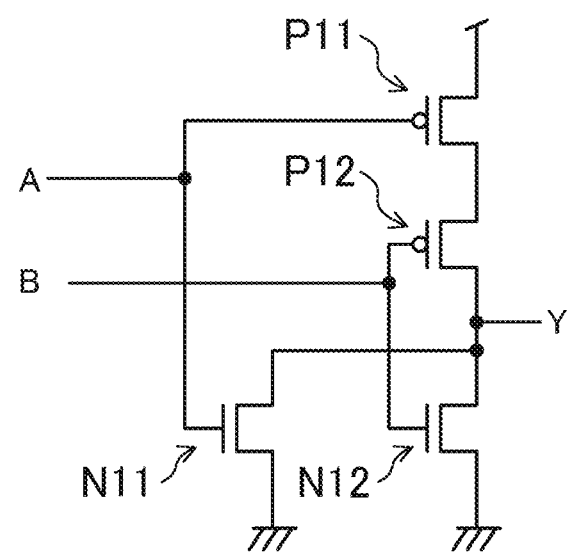
FIG. 2 is a circuit diagram of the standard cell of FIG. 1.

FIG. 1 is a plan view illustrating an exemplary layout configuration for a standard cell included in a semiconductor integrated circuit device according to the embodiment. The standard cell 1 shown in FIG. 1 constitutes a two-input NOR gate shown in the circuit diagram of FIG. 2 using nanowire FETs. In FIG. 1, the horizontal direction on the paper is X direction (corresponding to a first direction), and the vertical direction on the paper is Y direction (corresponding to a second direction).

The standard cell 1 shown in FIG. 1 includes four nanowire FETs. Specifically, the standard cell 1 is provided with a p-type transistor region PA and an n-type transistor region NA which are arranged in the Y direction. The p-type transistor region PA is provided with a p-type nanowire FET P11 and a p-type nanowire FET P12, and the n-type transistor region NA is provided with an n-type nanowire FET N11 and an n-type nanowire FET N12. As shown in the circuit diagram of FIG. 2, the nanowire FETs P11 and P12 are connected together in series, and the nanowire FETs N11 and N12 are connected together in parallel.

The nanowire FETs P11, P12, N11 and N12 are respectively provided with groups of nanowires 11, 12, 13 and 14. The groups of nanowires 11, 12, 13 and 14 each include a plurality of nanowires extending along the X direction and parallelly arranged. Here, the groups of nanowires 11, 12, 13, and 14 each include four nanowires arranged in the Y direction. As will be described later, the groups of nanowires 11, 12, 13, and 14 further each include two nanowires in the vertical direction, i.e., the direction perpendicular to the substrate. The groups of nanowires 11, 12, 13, and 14 each include eight nanowires in total. Each of the nanowires 11, 12, 13, and 14 is cylindrically shaped, and extends along the horizontal direction, i.e., parallel to the substrate. Each nanowire is comprised of, e.g., silicon. The standard cell 1 is provided with a group of pads 21, a group of pads 22, a group of pads 23, a group of pads 24, a group of pads 25, and a group of pads 26 connected to the nanowires 11, 12, 13, and 14. P-type impurities are introduced into at least portions of the pads 21, 22, and 23, the portions being connected to the nanowires 11 and 12, and serving as the source/drain regions of the nanowire FETs P11 and P12. N-type impurities are introduced into at least portions of the pads 24, 25, and 26, the portions being connected to the nanowires 13 and 14, and serving as the source/drain regions of the nanowire FETs N11 and N12.

Here, the groups of the pads 21, 22, 23, 24, 25, and 26 each include four pads separately arranged in the Y direction. The group of the pads 21 includes the separately arranged four pads respectively connected to the four nanowires 11 arranged in the Y direction. The group of the pads 22 includes the separately arranged four pads respectively connected to the four nanowires 11 arranged in the Y direction, and respectively connected to the four nanowires 12 arranged in the Y direction. The group of the pads 23 includes the separately arranged four pads respectively connected to the four nanowires 12 arranged in the Y direction. The group of the pads 24 includes the separately arranged four pads respectively connected to the four nanowires 13 arranged in the Y direction. The group of the pads 25 includes the separately arranged four pads respectively connected to the four nanowires 13 arranged in the Y direction, and respectively connected to the four nanowires 14 arranged in the Y direction. The group of the pads 26 includes the separately arranged four pads respectively connected to the four nanowires 14 arranged in the Y direction.

The nanowire FETs P11 and P12 connected together in series share the pads 22. That is to say, the nanowire FET P11 includes the pads 21 and 22 connected to the nanowires 11, and the nanowire FET P12 includes the pads 22 and 23 connected to the nanowires 12. The nanowire FETs N11 and N12 connected together in parallel share the pads 25. That is to say, the nanowire FET N11 includes the pads 24 and 25 connected to the nanowires 13, and the nanowire FET N12 includes the pads 25 and 26 connected to the nanowires 14.

The standard cell 1 is provided with two gate lines 31 and 32 which extend linearly along the Y direction. The gate line 31 is comprised of a gate electrode 31p in the nanowire FET P11 and a gate electrode 31n in the nanowire FET N11 which are integrally formed with each other, and is provided within a predetermined range of the nanowires 11 and 13 in the X direction so as to surround the periphery of the nanowires 11 and 13. The gate line 32 is comprised of a gate electrode 32p in the nanowire FET P12 and a gate electrode 32n in the nanowire FET N12 which are integrally formed with each other, and is provided within a predetermined range of the nanowires 12 and 14 in the X direction so as to surround the periphery of the nanowires 12 and 14. Sides of a cell frame CF of the standard cell 1 are provided with dummy gate lines 35 and 36 extending along the Y direction.

A metal interconnect layer M1 is formed above the nanowire FETs P11, P12, N11, and N12. The metal interconnect layer M1 includes an interconnect VDD disposed on the upper side of the cell frame CF and supplying a power supply potential, and an interconnect VSS disposed on the lower side of the cell frame CF and supplying a ground potential. The metal interconnect layer M1 further includes interconnects 41a to 41f. The interconnect 41a is formed so as to extend downward from the interconnect VDD along the Y direction, and is connected to the pads 21 through a local interconnect 45a. The interconnect 41b is formed so as to extend upward from the interconnect VSS along the Y direction, and is connected to the pads 24 through a local interconnect 45b. The interconnect 41c is formed so as to extend upward from the interconnect VSS along the Y direction, and is connected to the pads 26 through a local interconnect 45c. The interconnect 41d connects the pads 23 and 25 together, and is connected to the pads 23 through a local interconnect 45d, and is connected to the pads 25 through a local interconnect 45e. The interconnect 41e is connected to the gate line 31 through a local interconnect 45f. The interconnect 41f is connected to the gate line 32 through a local interconnect 45g. The interconnects 41d, 41e, and 41f are respectively associated with an output Y, an input A, and an input B in the 2-input NOR circuit. A local interconnect 45h is disposed on the pads 22. Although the local interconnect 45h is connected to the pads 22, it is not connected to any interconnect of the metal interconnect layer M1.

The metallic interconnects 41a to 41f are connected to the pads 21, 23, 24, 25, and 26 and the gate lines 31 and 32 through the local interconnects 45a, 45b, 45c, 45d, 45e, 45f, and 45g and contacts 43. Alternatively, the metallic interconnects may be connected to the pads and the gate lines only through the local interconnects, not through the contact, or may be connected to the pads and the gate lines only through the contact, not through the local interconnects.

Figure 3:
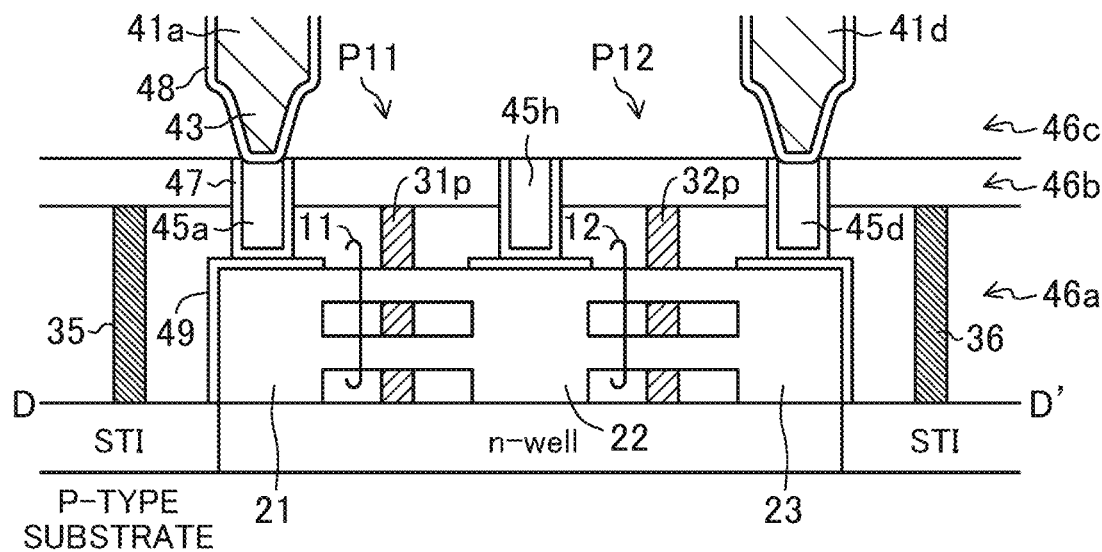
FIG. 3 is a cross-sectional view of the standard cell of FIG. 1.
Figure 4:
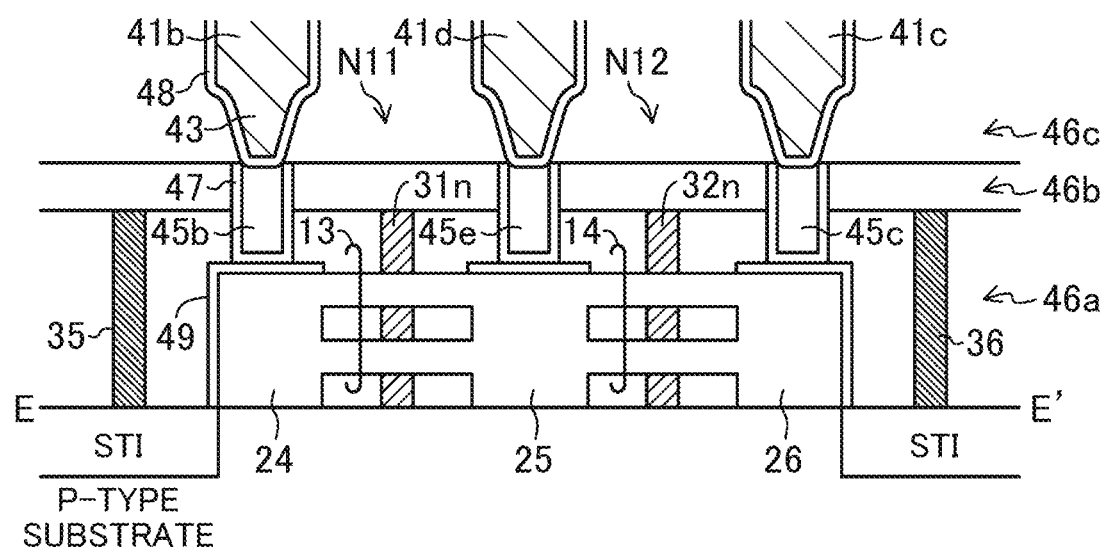
FIG. 4 is another cross-sectional view of the standard cell of FIG. 1.
Figure 5:
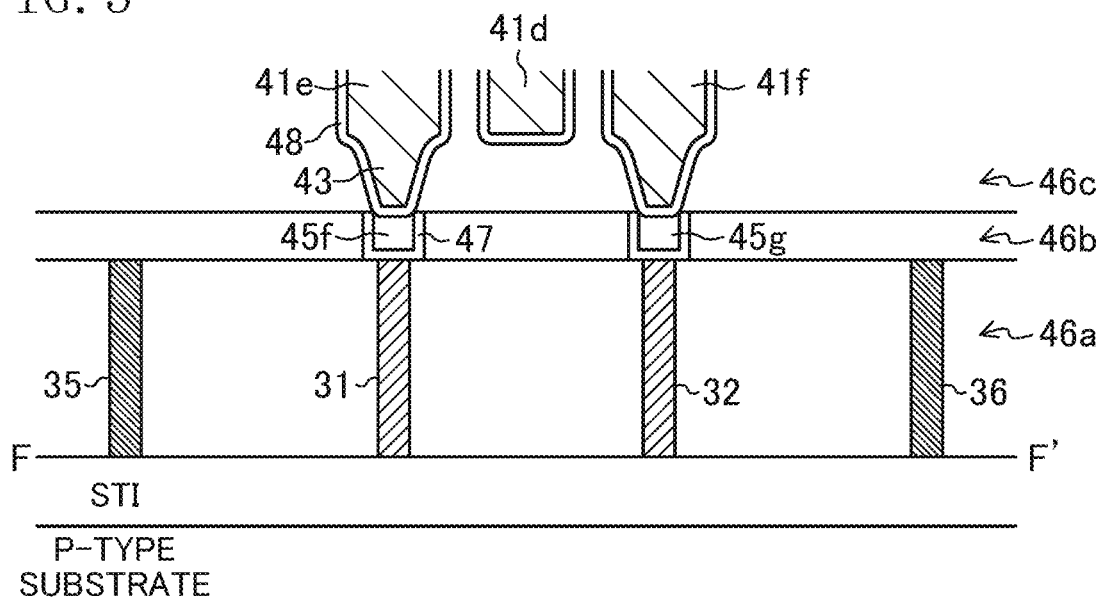
FIG. 5 is yet another cross-sectional view of the standard cell of FIG. 1.

FIG. 3 is a cross-sectional view of the layout configuration of FIG. 1 taken along line D-D'. FIG. 4 is a cross-sectional view of the layout configuration of FIG. 1 taken along line E-E'. FIG. 5 is a cross-sectional view of the layout configuration of FIG. 1 taken along line F-F'.

As shown in FIGS. 3 to 5, the interconnects 41a to 41f of the metal interconnect layer M1 are connected to the local interconnect 45a to 45g through contacts 43. The contacts 43 are formed together with the interconnects 41a to 41f of the metal interconnect layer M1 using a dual-damascene process. The contacts 43 may be formed separately from the interconnects 41a to 41f of the metal interconnect layer M1. The interconnects 41a to 41f of the metal interconnect layer M1 are made of, e.g., Cu, and include surfaces on which a barrier metal 48 including, e.g., tantalum or tantalum nitride is formed. The local interconnects 45a to 45g are made of, e.g., tungsten, and include surfaces on which a glue film 47 including, e.g., titanium or titanium nitride is formed. The local interconnects 45a to 45g may be formed by cobalt. In this case, the glue film 47 may be omitted. The pads 21 to 26 include surfaces on which a silicide film 49 made of, e.g., nickel or cobalt is formed.

Interlayer insulating films 46a and 46b are, e.g., a silicon oxide film. The interlayer insulating film 46c is a low dielectric constant film such as SiOC or a porous film. The interlayer insulating film 46c has a multilayer structure including two or more layers.

The gate electrodes 31p, 31n, 32p, and 32n are made of, e.g., polysilicon. The gate electrodes 31p, 31n, 32p, and 32n may be made of a material including a metal such as titanium nitride. A gate insulating film is, e.g., a silicon oxide film, and is formed by, e.g., thermal oxidation. The gate insulating film may be formed by an oxide of, e.g., hafnium, zirconium, lanthanum, yttrium, aluminum, titanium or tantalum.

As can be seen from the cross-sectional views of FIGS. 3 to 5, the lower surfaces of the pads 21, 22, 23, 24, 25, and 26 are below those of the nanowires 11, 12, 13, 14. The upper surfaces of the nanowires 11, 12, 13, and 14 are at the same height as those of the pads 21, 22, 23, 24, 25, and 26. The gate electrodes 31p, 32p, 31n, and 32n are formed so as to surround the periphery of the nanowires 11, 12, 13, and 14. That is to say, all of upper, lower, and both side surfaces of the channel regions formed in the nanowires 11, 12, 13, and 14 are surrounded by the gate electrodes 31p, 32p, 31n, and 32n through the insulating films. The upper surfaces of the nanowires 11, 12, 13, and 14 may be below the upper surfaces of the pads 21, 22, 23, 24, 25, and 26.

Figure 6:
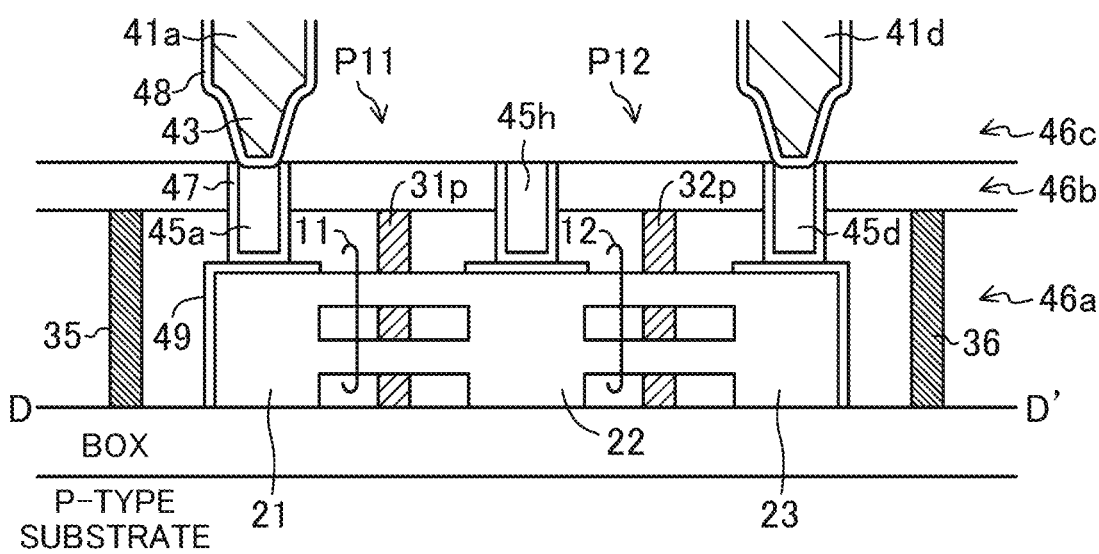
FIG. 6 is still yet another cross-sectional view of the standard cell of FIG. 1.

A buried oxide (BOX) may be formed on the upper surface of the substrate. FIG. 6 is a cross-sectional view of the layout configuration of FIG. 1 taken along line D-D', and illustrates a configuration in which a BOX is formed on the upper surface of the substrate.

In the standard cell 1 of FIG. 1, the pads are arranged at an equal pitch Pp in the X direction. That is to say, the pads 21, 22, and 23 are arranged in the p-type transistor region PA at the pitch Pp, and the pads 24, 25, and 26 are arranged in the n-type transistor region NA at the pitch Pp. In the X direction, the positions of the pads in the p-type transistor region PA are consistent with those of the pads in the n-type transistor region NA. That is to say, in the X direction, the positions of the pads 21 and 24 are consistent with one another. Likewise, the positions of the pads 22 and 25 are consistent with one another, and the positions of the pads 23 and 26 are consistent with one another. The widths Wp of the pads each of which is the dimension of the pad in the X direction are all the same, and intervals Sp which are intervals between the adjacent pads in the X direction are all the same. Therefore, the following relation is satisfied:

$Pp=Wp+Sp$

An interval between the cell frame CF and the center line of each of the closest pads 21, 23, 24, 26 to the cell frame CF is ½ of the pitch Pp between the pads. As a result, a cell width Wcell of the standard cell 1 that is the dimension in the X direction is an integral multiplication of, here, three times, the pitch Pp between the pads.

In the standard cell 1 of FIG. 1, the gate lines including the dummy gate lines are arranged at an equal pitch Pg in the X direction. The widths Wg of the gate lines each of which is the dimension of the gate line in the X direction are all the same, and intervals Sg which are intervals between the adjacent gate lines in the X direction are all the same. Therefore, the following relation is satisfied:

$Pg=Wg+Sg$

A pitch Pg between the gate lines is equal to the pitch Pp between the pads. That is to say, the following relation is satisfied:

$Pp=Pg$ (Standard Cell 2)

Figure 7:
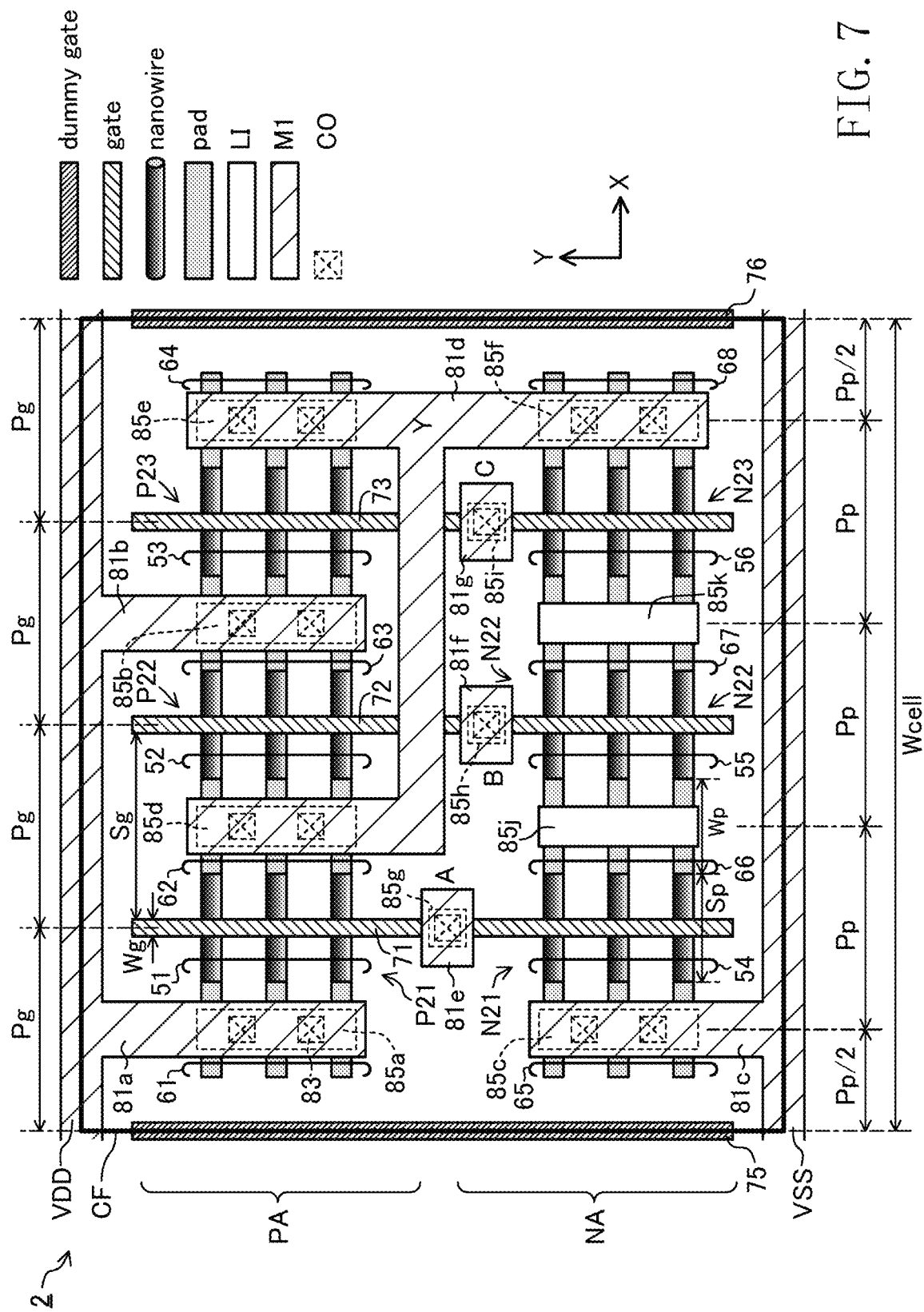
FIG. 7 is a plan view illustrating another exemplary configuration for the standard cell with the nanowire FET.
Figure 8:
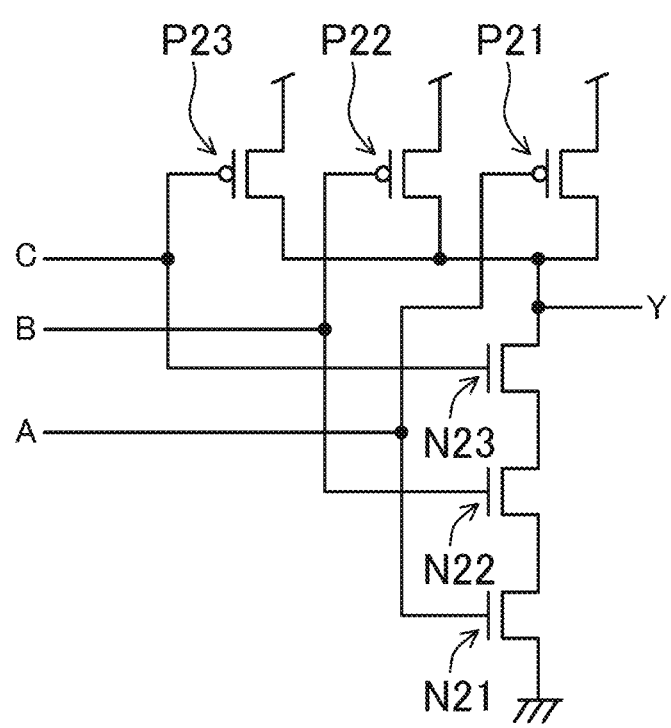
FIG. 8 is a circuit diagram of the standard cell of FIG. 7.

FIG. 7 is a plan view of illustrating another exemplary layout configuration for a standard cell included in a semiconductor integrated circuit device according to the embodiment. The standard cell 2 shown in FIG. 7 constitutes a three-input NAND gate shown in the circuit diagram of FIG. 8 using nanowire FETs. In FIG. 7, just like in FIG. 1, the horizontal direction on the paper is X direction (corresponding to a first direction), and the vertical direction on the paper is Y direction (corresponding to a second direction). Its cross-sectional structure is the same as or similar to that shown in FIGS. 3 to 5, its illustration will be omitted.

The standard cell 2 shown in FIG. 7 includes six nanowire FETs. That is to say, the standard cell 2 is provided with a p-type transistor region PA and an n-type transistor region NA which are arranged in the Y direction. The p-type transistor region PA is provided with a p-type nanowire FET P21, a p-type nanowire FET P22, and a p-type nanowire FET P23. The n-type transistor region NA is provided with an n-type nanowire FET N21, an n-type nanowire FET N22, and an n-type nanowire FET N23. As shown in the circuit diagram of FIG. 8, the nanowire FETs P21, P22, and P23 are connected together in parallel, and the nanowire FETs N21, N22, and N23 are connected together in series.

The nanowire FETs P21, P22, P23, N21, N22, and N23 are respectively provided with groups of nanowires 51, 52, 53, 54, 55 and 56. The groups of nanowires 51, 52, 53, 54, 55 and 56 each include a plurality of nanowires extending along the X direction and parallelly arranged. Here, the groups of nanowires 51, 52, 53, 54, 55, and 56 each include three nanowires arranged in the Y direction. The groups of nanowires 51, 52, 53, 54, 55, and 56 further each include two nanowires in the vertical direction, i.e., the direction perpendicular to the substrate. The groups of nanowires 51, 52, 53, 54, 55, and 56 each include six nanowires in total. Each of the nanowires 51, 52, 53, 54, 55, and 56 is cylindrically shaped, and extends along the horizontal direction, i.e., parallel to the substrate. Each nanowire is comprised of, e.g., silicon. The standard cell 2 is provided with a group of pads 61, a group of pads 62, a group of pads 63, a group of pads 64, a group of pads 65, a group of pads 66, a group of pads 67, and a group of pads 68 connected to the nanowires 51, 52, 53, 54, 55, and 56. P-type impurities are introduced into at least portions of the pads 61, 62, 63, and 64, the portions being connected to the nanowires 51, 52, and 53, and serving as the source/drain regions of the nanowire FETs P21, P22, and P23. N-type impurities are introduced into at least portions of the pads 65, 66, 67, and 68, the portions being connected to the nanowires 54, 55, and 56, and serving as the source/drain regions of the nanowire FETs N21, N22, and N23.

Here, the groups of the pads 61, 62, 63, 64, 65, 66, 67, and 68 each include three pads separately arranged in the Y direction. The group of the pads 61 includes the separately arranged three pads respectively connected to the three nanowires 51 arranged in the Y direction. The group of the pads 62 includes the separately arranged three pads respectively connected to the three nanowires 51 arranged in the Y direction, and respectively connected to the three nanowires 52 arranged in the Y direction. The group of the pads 63 includes the separately arranged three pads respectively connected to the three nanowires 52 arranged in the Y direction, and respectively connected to the three nanowires 53 arranged in the Y direction. The group of the pads 64 includes the separately arranged three pads respectively connected to the three nanowires 53 arranged in the Y direction. The group of the pads 65 includes the separately arranged three pads respectively connected to the three nanowires 54 arranged in the Y direction. The group of the pads 66 includes the separately arranged three pads respectively connected to the three nanowires 54 arranged in the Y direction, and respectively connected to the three nanowires 55 arranged in the Y direction. The group of the pads 67 includes the separately arranged three pads respectively connected to the three nanowires 55 arranged in the Y direction, and respectively connected to the three nanowires 56 arranged in the Y direction. The group of the pads 68 includes the separately arranged three pads respectively connected to the three nanowires 56 arranged in the Y direction.

The nanowire FETs P21 and P22 connected together in parallel share the pads 62, and the nanowire FETs P22 and P23 connected together in parallel share the pads 63. That is to say, the nanowire FET P21 includes the pads 61 and 62 connected to the nanowires 51, the nanowire FET P22 includes the pads 62 and 63 connected to the nanowires 52, and the nanowire FET P23 includes the pads 63 and 64 connected to the nanowires 53. The nanowire FETs N21 and N22 connected together in series share the pads 66, and the nanowire FETs N22 and N23 connected together in parallel share the pads 67. That is to say, the nanowire FET N21 includes the pads 65 and 66 connected to the nanowires 54, the nanowire FET N22 includes the pads 66 and 67 connected to the nanowires 55, and the nanowire FET N23 includes the pads 67 and 68 connected to the nanowires 56.

The standard cell 2 is provided with three gate lines 71, 72, and 73 extending along the Y direction. The gate line 71 is comprised of a gate electrode 71$p$ in the nanowire FET P21 and a gate electrode 71$n$ in the nanowire FET N21 which are integrally formed with each other, and is provided within a predetermined range of the nanowires 51 and 54 in the X direction so as to surround the periphery of the nanowires 51 and 54. The gate line 72 is comprised of a gate electrode 72$p$ in the nanowire FET P22 and a gate electrode 72$n$ in the nanowire FET N22 which are integrally formed with each other, and is provided within a predetermined range of the nanowires 52 and 55 in the X direction so as to surround the periphery of the nanowires 52 and 55. The gate line 73 is comprised of a gate electrode 73$p$ in the nanowire FET P23 and a gate electrode 73$n$ in the nanowire FET N23 which are integrally formed with each other, and is provided within a predetermined range of the nanowires 53 and 56 in the X direction so as to surround the periphery of the nanowires 53 and 56. Sides of a cell frame CF of the standard cell 2 are provided with dummy gate lines 75 and 76 extending along the Y direction.

A metal interconnect layer M1 is formed above the nanowire FETs P21, P22, P23, N21, N22, and N23. The metal interconnect layer M1 includes an interconnect VDD disposed on the upper side of the cell frame CF and supplying a power supply potential, and an interconnect VSS disposed on the lower side of the cell frame CF and supplying a ground potential. The metal interconnect layer M1 further includes interconnects 81$a$ to 81$g$. The interconnect 81$a$ is formed so as to extend downward from the interconnect VDD along the Y direction, and is connected to the pads 61 through a local interconnect 85$a$. The interconnect 81$b$ is formed so as to extend downward from the interconnect VDD along the Y direction, and is connected to the pads 63 through a local interconnect 85$b$. The interconnect 81$c$ is formed so as to extend upward from the interconnect VSS along the Y direction, and is connected to the pads 65 through a local interconnect 85$c$. The interconnect 81$d$ connects the pads 62, 64, and 68 together, and is connected to the pads 62 through a local interconnect 85$d$, is connected to the pads 64 through a local interconnect 85$e$, and is connected to the pads 68 through a local interconnect 85$f$. The interconnect 81$e$ is connected to the gate line 71 through a local interconnect 85$g$. The interconnect 81$f$ is connected to the gate line 72 through a local interconnect 85$h$. The interconnect 81$g$ is connected to the gate line 73 through a local interconnect 85$i$. The interconnects 81$d$, 81$e$, 81$f$, and 81$g$ are respectively associated with an output Y, an input A, an input B, and an input C in the three-input NAND circuit. A local interconnect 85$j$ is disposed on the pads 66, and a local interconnect 85$k$ is disposed on the pads 67. The local interconnect 85$j$ is connected to the pads 66, and the local interconnect 85$k$ is connected to the pads 67.

The metallic interconnects 81$a$, 81$b$, 81$c$, 81$d$, 81$e$, 81$f$, and 81$g$ are connected to the pads 61, 62, 63, 64, 65, and 68 and the gate lines 71, 72, and 73 through the local interconnects 85$a$, 85$b$, 85$c$, 85$d$, 85$e$, 85$f$, 85$g$, 85$h$, and 85$i$ and a contact 83. Alternatively, the metallic interconnects may be connected to the pads and the gate lines only through the local interconnects, not through the contact, or may be connected to the pads and the gate lines only through the contact, not through the local interconnects.

The cross-sectional structure of the standard cell 2 is the same as or similar to that of the standard cell 1. That is to say, the lower surfaces of the pads 61, 62, 63, 64, 65, 66, 67, and 68 are below those of nanowires 51, 52, 53, 54, 55, and 56. The upper surfaces of the nanowires 51, 52, 53, 54, 55, and 56 are at the same height as those of the pads 61, 62, 63, 64, 65, 66, 67, and 68. The gate electrodes 71$p$, 72$p$, 73$p$, 71$n$, 72$n$, and 73$n$ are formed so as to surround the periphery of the nanowires 51, 52, 53, 54, 55, and 56. That is to say, all of upper, lower, and both side surfaces of the channel regions formed in the nanowires 51, 52, 53, 54, 55, and 56 are surrounded by the gate electrodes 71$p$, 72$p$, 73$p$, 71$n$, 72$n$, and 73$n$ through the insulating films. The upper surfaces of the nanowires 51, 52, 53, 54, 55, and 56 may be below the upper surfaces of the pads 61, 62, 63, 64, 65, 66, 67, and 68.

In the standard cell 2 of FIG. 7, the pads are arranged at an equal pitch Pp in the X direction. That is to say, the pads 61, 62, 63, and 64 are arranged in the p-type transistor region PA at the pitch Pp, and the pads 65, 66, 67, and 68 are arranged in the n-type transistor region NA at the pitch Pp. In the X direction, the positions of the pads in the p-type transistor region PA are consistent with those of the pads in the n-type transistor region NA. That is to say, in the X direction, the positions of the pads 61 and 65 are consistent with one another. Likewise, the positions of the pads 62 and 66 are consistent with one another, the positions of the pads 63 and 67 are consistent with one another, and the positions of the pads 64 and 68 are consistent with one another. The widths Wp of the pads are all the same, and intervals Sp which are intervals between the adjacent pads in the X direction are all the same. Therefore, the following relation is satisfied:

$$Pp=Wp+Sp$$

An interval between the cell frame CF and the center line of each of the closest pads 61, 64, 65, and 68 to the cell frame CF is ½ of the pitch Pp between the pads. As a result, a cell width Wcell of the standard cell 2 is an integral multiplication of, here, four times, the pitch Pp between the pads.

In the standard cell 2 of FIG. 7, the gate lines including the dummy gate lines are arranged at an equal pitch Pg in the X direction. The widths Wg of the gate lines are all the same, and intervals Sg which are intervals between the adjacent gate lines in the X direction are all the same. Therefore, the following relation is satisfied:

$$Pg=Wg+Sg$$

A pitch Pg between the gate lines is equal to the pitch Pp between the pads. That is to say, the following relation is satisfied:

$$Pp=Pg$$

(Others)

Figure 9:
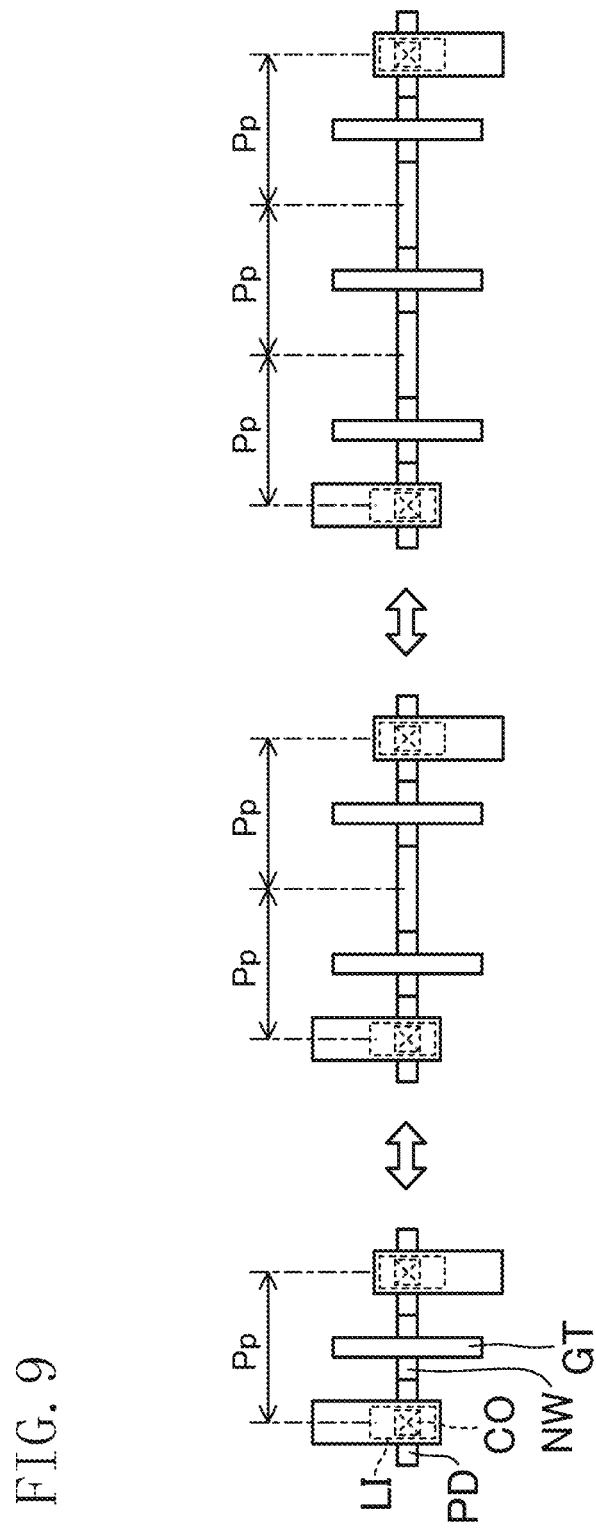
FIG. 9 schematically illustrates variation in layout if the number of nanowire FETs connected together in series is changed.

FIG. 9 schematically illustrates how a layout is altered due to an increase or decrease in the number of the nanowire FETs. As shown in a left portion of FIG. 9, in a situation where one nanowire FET is provided, two pads PD serving as the source/drain region are arranged at an equal pitch Pp, and a gate electrode GT is formed so as to surround a periphery of a nanowire NW connected to the pads PD. As shown in a center portion of FIG. 9, in a situation where two nanowire FETs are provided, three pads PD are arranged at an equal pitch Pp, and two gate electrodes GT are formed such that each gate electrode GT surrounds a periphery of a nanowire NW between the adjacent pads PD. This corresponds to the layout of the p-type transistor region PA in the standard cell 1 shown in FIG. 1. As shown in a right portion of FIG. 9, in a situation where three nanowire FETs are provided, four pads PD are arranged at an equal pitch Pp, and three gate electrodes GT are formed such that each gate electrode GT surrounds a periphery of a nanowire NW between the adjacent pads PD. This corresponds to the layout of the n-type transistor region NA in the standard cell 2 shown in FIG. 7.

Figure 10:
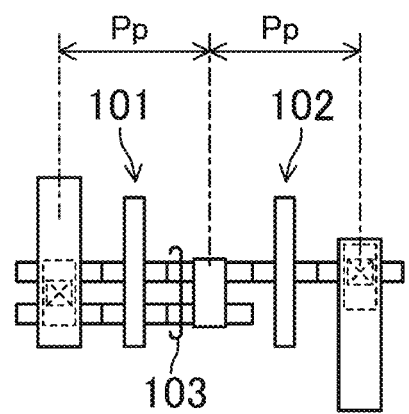
FIG. 10 illustrates an exemplary layout of the nanowire FET.

FIG. 10 illustrates an exemplary layout of the nanowire FET. In the example of FIG. 10, a first transistor 101 and a second transistor 102 are connected together in series, sharing pads 103. The number of nanowires differs between the first transistor 101 and the second transistor 102. The first transistor 101 includes two nanowires and the second transistor 102 includes one nanowire.

Figure 11:
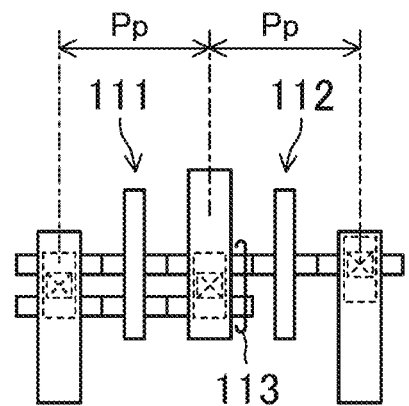
FIG. 11 illustrates another exemplary layout of the nanowire FET.

FIG. 11 illustrates another exemplary layout of the nanowire FET. In the example of FIG. 11, a first transistor 111 and a second transistor 112 are connected together in parallel, sharing pads 113. The number of nanowires differs between the first transistor 111 and the second transistor 112. The first transistor 111 includes two nanowires and the second transistor 112 includes one nanowire.

(Exemplary Layout Configuration for Semiconductor Integrated Circuit Device)

Figure 12:
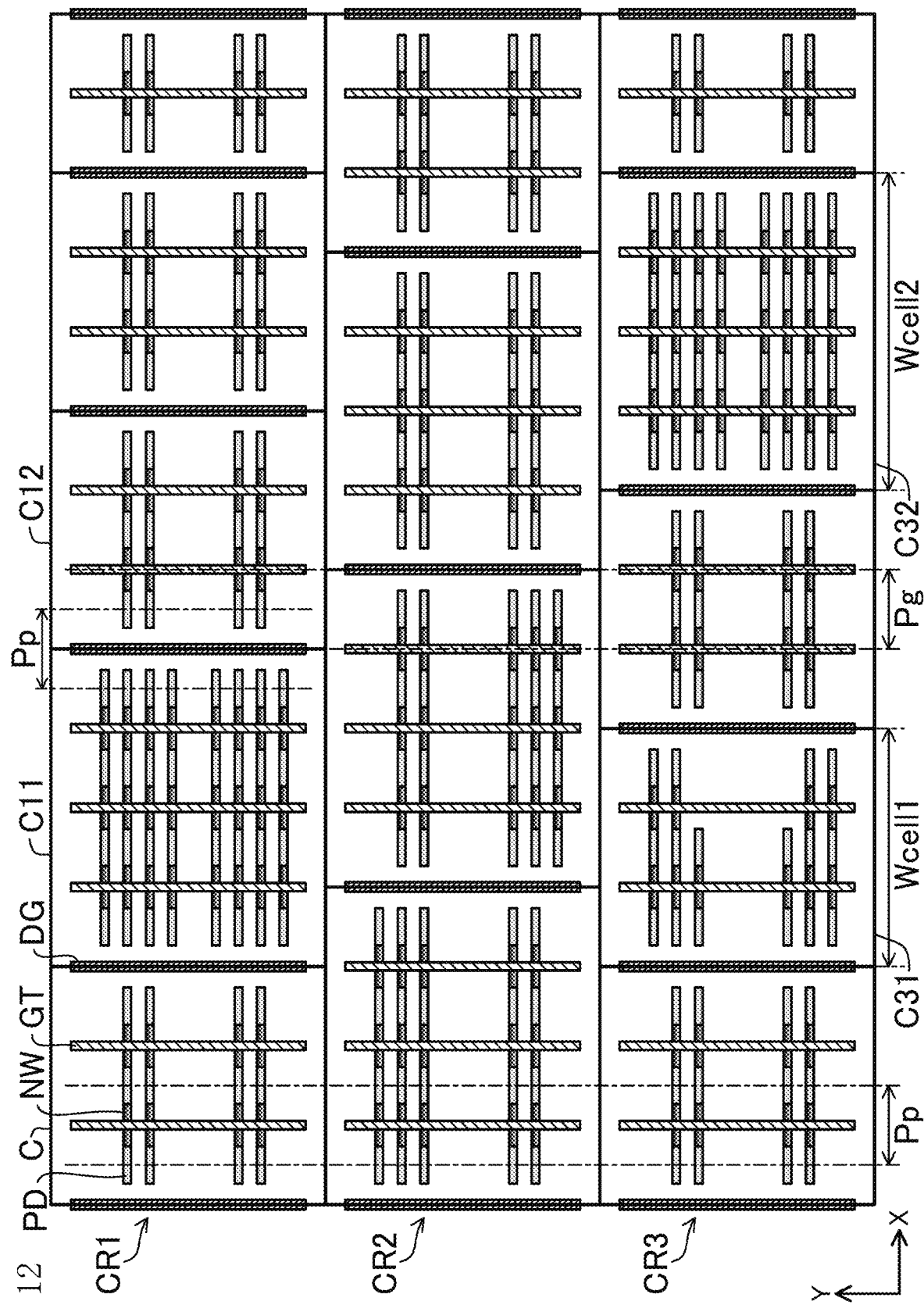
FIG. 12 illustrates an exemplary layout configuration for a semiconductor integrated circuit device.

FIG. 12 illustrates an exemplary layout configuration for a semiconductor integrated circuit device. The above described standard cells (for the sake of convenience, hereinafter simply referred to as "the cells") C, C11, C12, . . . are used to configure the layout of FIG. 12. In FIG. 12, illustration of the configuration for the local interconnects and illustration of a configuration of the metal interconnect layer M1 and of upper layers above the metal interconnect layer M1 will be omitted. Cell rows CR1, CR2, and CR3 are arranged in the Y direction. In each of the cell rows CR1, CR2, and CR3, the cells C, C11, C12, . . . are arranged in the X direction. Each cell C includes the pads PD, the nanowire NW, and the gate line GT. A dummy gate line DG is disposed in a boundary between adjacent ones of the cells C, C11, C12 . . . . The dummy gate line DG is also disposed at both ends of each of the cell rows CR1, CR2, and CR3.

In the layout of FIG. 12, the pads PD are regularly arranged. The pads PD are arranged at a predetermined pitch Pp in the X direction, and are aligned in the Y direction. The pitch Pp of the pads PD is also maintained in the boundaries between adjacent cells C, C11, C12 . . . . For example, in the adjacent cells C11 and C12 in the X direction, the pads of the cell C11 and the pads of the cell C12 facing each other across the cell boundary are arranged at the pitch Pp. The cell width of each of the cells C, C11, and C12 is an integral multiplication of the pitch Pp between the pads PD. For example, a cell width Wcell1 of a cell C31 is three times the pitch Pp between the pads PD, and a cell width Wcell2 of a cell C32 is four times the pitch Pp between the pads PD.

In the layout of FIG. 12, the gate lines GT and the dummy gate lines DG are regularly arranged. The gate lines GT and the dummy gate lines DG are arranged at the predetermined pitch Pg in the X direction, and are aligned in the Y direction. This pitch Pg is equal to the pitch Pp between the pads PD.

As can be seen, according to the embodiment, in the standard cells 1 and 2 including the nanowire FETs, the pads connected to the nanowires are arranged at the predetermined pitch Pp in the X direction along which the nanowires extend. The cell width Wcell of each of the standard cells 1 and 2 is an integral multiplication of the pitch Pp between the pads. Therefore, in the case where the layout of the semiconductor integrated circuit device is configured by arranging the standard cells such as the standard cells 1 and 2, the pads are regularly arranged in the X direction. Accordingly, in the semiconductor integrated circuit device including the nanowire FET(s), the pads are regularly arranged. This can make the manufacture of the device easy, reduce process induced variation, and improve yield.

The nanowire FETs connected together in series share one pad, and are arranged to be adjacent to one another in the X direction. As a result, the nanowire FETs connected together in series are formed with a configuration in which the three pads are arranged at the pitch Pp in the X direction. Accordingly, in the semiconductor integrated circuit device including the nanowire FET(s), the pads are regularly arranged. This can make the manufacture of the device easy, reduce process induced variation, and improve yield.

The nanowire FETs connected together in parallel share one pad, and are arranged to be adjacent to one another in the X direction. As a result, the nanowire FETs connected together in parallel are formed with a configuration in which the three pads are arranged at the pitch Pp in the X direction. Accordingly, in the semiconductor integrated circuit device including the nanowire FET(s), the pads are regularly arranged. This can make the manufacture of the device easy, reduce process induced variation, and improve yield.

In the above description, the nanowire is cylindrically shaped. However, the shape of the nanowire is not limited thereto. For example, the cross-sectional shape of the nanowire may be oval- or elliptically-shaped or the nanowire may be in the shape of a prism such as a rectangular prism.

Figure 13:
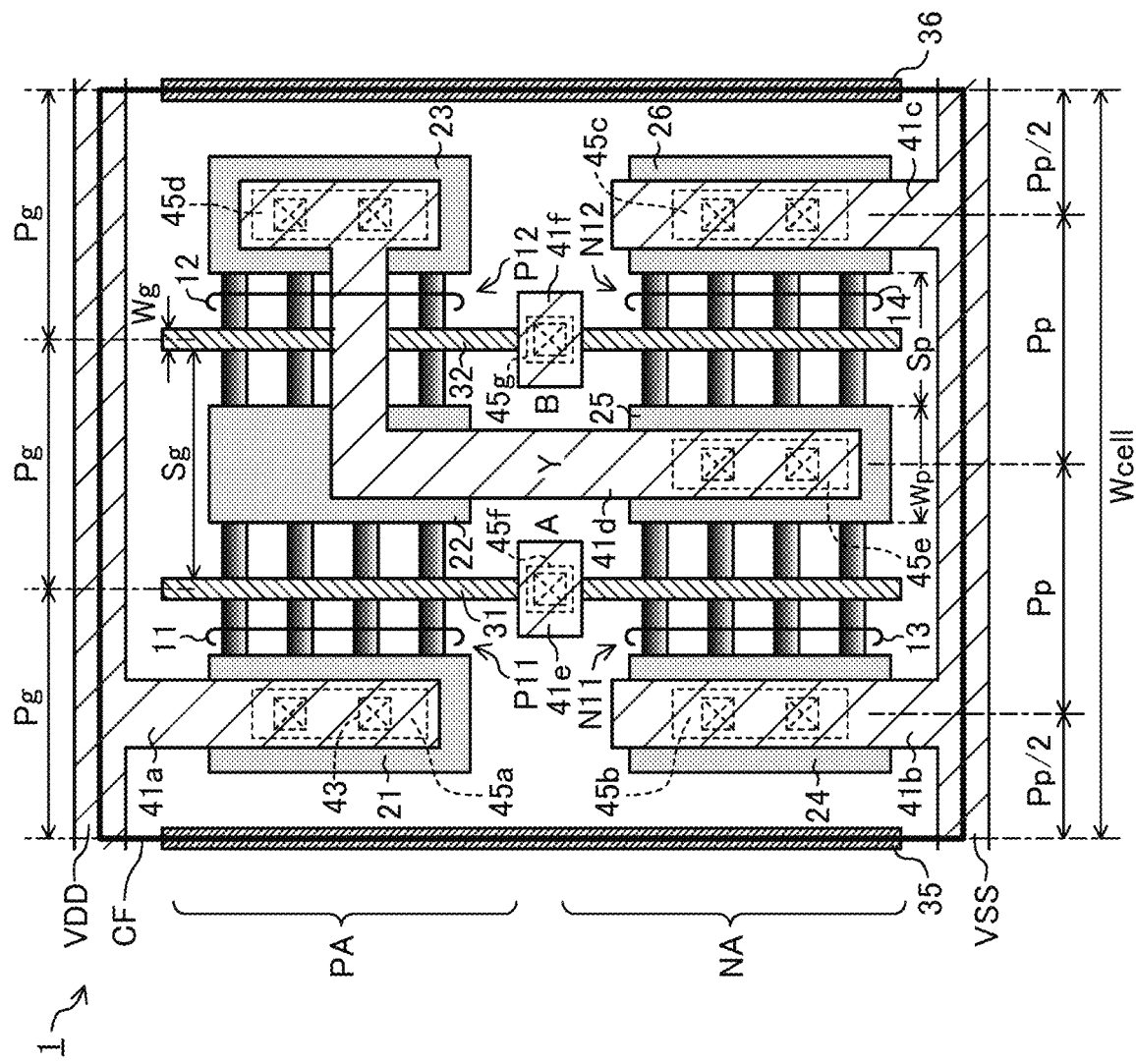
FIG. 13 is a variation of the standard cell of FIG. 1.

In the above description, in the nanowire FET, the pads are separately formed so as to correspond to the nanowires in the Y direction. However, instead of the separate pads, a single pad may be provided with respect to the plurality of nanowires arranged in the Y direction. FIG. 13 is a variation of the exemplary layout configuration of FIG. 1. In FIG. 13, the pad 21 provided as a single pad, the pad 22 provided as a single pad, and the pad 23 provided as a single pad correspond to the nanowires 11 and 12 each including four nanowires arranged in the Y direction, and the pad 24 provided as a single pad, the pad 25 provided as a single pad, and the pad 26 provided as a single pad correspond to the nanowires 13 and 14 each including four nanowires arranged in the Y direction.

In the above description, in the standard cell, the widths of the pads are all the same, and the intervals between the pads are all the same. However, this is an non-limiting example. For example, the standard cell may include pads having different widths, and its interval between the pads may be different. In this case, arranging the pads at an equal pitch achieves a regular layout pattern of the pads. The positions of the pads in the p-type transistor region do not have to be consistent with those of the pads in the n-type transistor region in the X direction. However, they are preferably consistent with one another.

In the above description, the pitch between the gate lines is equal to the pitch between the pads. However, this is a non-limiting example. The gate line extends linearly along the Y direction in the p-type transistor region and the n-type transistor region. However, this is a non-limiting example.

The present disclosure provides, in a semiconductor integrated circuit device including a nanowire FET, a layout configuration effective for making manufacturing the device easy, and is useful for improving performance of the semiconductor integrated circuit device.

What is claimed is:

1. A semiconductor integrated circuit device comprising
a first standard cell constituting a NOR gate and including first and second p-type nanowire field effect transistors (FETs), and first and second n-type nanowire FETs,
the first and second p-type nanowire FETs are connected together in series, and the first and second n-type nanowire FETs are connected together in parallel,
each of the first and second p-type nanowire FETs and the first and second n-type nanowire FETs including:
a nanowire extending along a first direction, the nanowire being a single nanowire or including a plurality of nanowires;
first and second pads arranged at both ends of the nanowire in the first direction, and connected to the nanowire; and
a gate electrode extending along a second direction perpendicular to the first direction, and surrounding a periphery of the nanowire, wherein:
the first pad of the first p-type nanowire FET, the first pad of the second p-type nanowire FET, and the second pad of the second p-type nanowire FET are arranged at a first pitch in the first direction,
the first pad of the first n-type nanowire FET, the first pad of the second n-type nanowire FET, and the second pad of the second n-type nanowire FET are arranged at the first pitch in the first direction,
a cell width of the first standard cell that is a dimension of the first standard cell in the first direction is an integral multiplication of the first pitch, and
the gate electrode of the first p-type nanowire FET and the gate electrode of the first n-type nanowire FET are integrally formed with each other as a first gate line extending in the second direction, the gate electrode of the second p-type nanowire FET and the gate electrode of the second n-type nanowire FET are integrally formed with each other as a second gate line extending in the second direction.

2. The semiconductor integrated circuit device of claim 1, wherein
the first and second pads of the first and second p-type nanowire FETs and the first and second n-type nanowire FETs have the same pad width that is a dimension of each of the first and second pads in the first direction.

3. The semiconductor integrated circuit device of claim 1, wherein
pad intervals between the first and second pads of the first and second p-type nanowire FETs and the first and second n-type nanowire FETs are the same.

4. The semiconductor integrated circuit device of claim 1, wherein
in the first direction, positions of the first and second pads of the first and second p-type nanowire FETs are consistent with positions of the first and second pads of the first and second n-type nanowire FETs, respectively.

5. The semiconductor integrated circuit device of claim 1 further comprising
a second standard cell arranged adjacent to the first standard cell in the first direction, wherein
a pad in the first standard cell and a pad in the second standard cell facing each other across a cell boundary between the first and second standard cells are arranged at the first pitch in the first direction.

6. The semiconductor integrated circuit device of claim 5, wherein
a cell width of the second standard cell that is a dimension of the second standard cell in the first direction is an integral multiplication of the first pitch.

7. The semiconductor integrated circuit device of claim 5, wherein
an interval between the cell boundary and a center line of the closest pad of the first standard cell to the cell boundary is a half of the first pitch.

8. The semiconductor integrated circuit device of claim 1, wherein
the first and second gate lines are arranged at the first pitch in the first direction.

9. The semiconductor integrated circuit device of claim 8, wherein
the first standard cell is provided with a p-type transistor region provided with the first and second p-type nanowire FETs, and an n-type transistor region provided with the first and second n-type nanowire FETs, the p-type and n-type transistor regions being arranged in the second direction.

10. The semiconductor integrated circuit device of claim 1, wherein
the nanowire includes a plurality of nanowires arranged in a third direction perpendicular to a substrate.

11. A semiconductor integrated circuit device comprising
a first standard cell constituting a NOR gate and including first, second and third p-type nanowire field effect transistors (FETs), and first, second and third n-type nanowire FETs,
the first, second and third p-type nanowire FETs are connected together in series, and the first, second and third n-type nanowire FETs are connected together in parallel, each of the first, second and third p-type nanowire FETs and the first, second and third n-type nanowire FETs including:
a nanowire extending along a first direction, the nanowire being a single nanowire or including a plurality of nanowires;
first and second pads arranged at both ends of the nanowire in the first direction, and connected to the nanowire; and
a gate electrode extending along a second direction perpendicular to the first direction, and surrounding a periphery of the nanowire, wherein:
the first pad of the first p-type nanowire FET, the first pad of the second p-type nanowire FET, the first pad of the third p-type nanowire FET, and the second pad of the third p-type nanowire FET are arranged at a first pitch in the first direction,
the first pad of the first n-type nanowire FET, the first pad of the second n-type nanowire FET, the first pad of the third n-type nanowire FET, and the second pad of the third n-type nanowire FET are arranged at the first pitch in the first direction, a cell width of the first standard cell that is a dimension of the first standard cell in the first direction is an integral multiplication of the first pitch, and the gate electrode of the first p-type nanowire FET and the gate electrode of the first n-type nanowire FET are integrally formed with each other as a first gate line extending in the second direction, the gate electrode of the second p-type nanowire FET and the gate electrode of the second n-type nanowire FET are integrally formed with each other as a second gate line extending in the second direction, the gate electrode of the third p-type nanowire FET and the gate electrode of the third n-type nanowire FET are integrally formed with each other as a third gate line extending in the second direction.

12. The semiconductor integrated circuit device of claim 11, wherein
the first and second pads of the first, second and third p-type nanowire FETs and the first, second and third n-type nanowire FETs have the same pad width that is a dimension of each of the first and second pads in the first direction.

13. The semiconductor integrated circuit device of claim 11, wherein
pad intervals between the first and second pads of the first, second and third p-type nanowire FETs and the first, second and third n-type nanowire FETs are the same.

14. The semiconductor integrated circuit device of claim 11, wherein
in the first direction, positions of the first and second pads of the first, second and third p-type nanowire FETs are consistent with positions of the first and second pads of the first, second and third n-type nanowire FETs, respectively.

15. The semiconductor integrated circuit device of claim 11 further comprising
a second standard cell arranged adjacent to the first standard cell in the first direction, wherein
a pad in the first standard cell and a pad in the second standard cell facing each other across a cell boundary between the first and second standard cells are arranged at the first pitch in the first direction.

16. The semiconductor integrated circuit device of claim 15, wherein
a cell width of the second standard cell that is a dimension of the second standard cell in the first direction is an integral multiplication of the first pitch.

17. The semiconductor integrated circuit device of claim 15, wherein
an interval between the cell boundary and a center line of the closest pad of the first standard cell to the cell boundary is a half of the first pitch.

18. The semiconductor integrated circuit device of claim 11, wherein
the first, second and third gate lines are arranged at the first pitch in the first direction.

19. The semiconductor integrated circuit device of claim 18, wherein
the first standard cell is provided with a p-type transistor region provided with the first, second and third p-type nanowire FETs, and an n-type transistor region provided with the first, second and third n-type nanowire FETs, the p-type and n-type transistor regions being arranged in the second direction.

20. The semiconductor integrated circuit device of claim 11, wherein
the nanowire includes a plurality of nanowires arranged in a third direction perpendicular to a substrate.

* * * * *